(12) United States Patent
Lee

(10) Patent No.: US 10,908,992 B2
(45) Date of Patent: Feb. 2, 2021

(54) CONTROLLER AND OPERATION METHOD THEREOF

(71) Applicant: SK hynix Inc., Gyeonggi-do (KR)

(72) Inventor: Jae-Yoon Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 36 days.

(21) Appl. No.: 16/291,077

(22) Filed: Mar. 4, 2019

(65) Prior Publication Data

US 2020/0065188 A1 Feb. 27, 2020

(30) Foreign Application Priority Data

Aug. 27, 2018 (KR) ...................... 110-2018-0100117

(51) Int. Cl.
| | |
|---|---|
| *G11C 29/00* | (2006.01) |
| *G06F 11/10* | (2006.01) |
| *G11C 29/52* | (2006.01) |
| *G11C 16/26* | (2006.01) |
| *G11C 16/04* | (2006.01) |
| *G11C 11/56* | (2006.01) |

(52) U.S. Cl.
CPC ...... *G06F 11/1068* (2013.01); *G11C 16/0483* (2013.01); *G11C 16/26* (2013.01); *G11C 29/52* (2013.01); *G11C 11/5642* (2013.01); *G11C 11/5671* (2013.01)

(58) Field of Classification Search
CPC ............. G06F 11/1048; G06F 11/1068; G06F 11/1012; G11C 16/0483; G11C 16/26; G11C 16/3413; G11C 29/021; G11C 29/52; G11C 16/10; H03M 13/293; H03M 13/29; H03M 13/2909; H03M 13/2927; H03M 13/2948; H03M 13/2906; H03M 13/2957; H03M 13/23; H03M 13/152; H03M 13/1515

See application file for complete search history.

(56) References Cited

U.S. PATENT DOCUMENTS

| | | | | |
|---|---|---|---|---|
| 2015/0095736 A1* | 4/2015 | Leem | ............... | G06F 11/141 |
| | | | | 714/758 |
| 2017/0177436 A1* | 6/2017 | Lee | ............... | G11C 29/52 |
| 2018/0004601 A1* | 1/2018 | Lee | ............... | H03M 13/45 |

FOREIGN PATENT DOCUMENTS

| | | |
|---|---|---|
| KR | 10-2016-0075001 | 6/2016 |
| KR | 10-2016-0102738 | 8/2016 |
| KR | 10-2017-0075065 | 7/2017 |

\* cited by examiner

*Primary Examiner* — Guerrier Merant
(74) *Attorney, Agent, or Firm* — IP & T Group LLP

(57) ABSTRACT

A controller for controlling a memory device includes a read control component suitable for controlling a recovery soft read operation of the memory device on bits contained in error correction-failed data groups, when error correction on data of a target data group and error correction on one or more of data of corresponding data groups failed; an error correction code (ECC) component suitable for performing the error correction, and performing a selective data recovery operation on the target data group depending on reliabilities of the respective bits, derived as a result of the recovery soft read operation; and a read bias determiner suitable for determining a recovery soft read voltage to maximize the number of bits recovered by the selective data recovery operation, among bits contained in the target data group.

18 Claims, 18 Drawing Sheets

FIG. 4A

|  | Index 0 | Index 1 | Index 2 | Index 3 | Index 4 | Index 5 | Index 6 | Index 7 | Index 8 | Index 9 | Index 10 | Index 11 | Index 12 | Index 13 | Index 14 | Index 15 |
|---|---|---|---|---|---|---|---|---|---|---|---|---|---|---|---|---|
| 1st Data group ⊕ | 1 | 0 | 1 | 0 | 1 | 0 | 1 | 0 | 1 | 0 | 1 | 0 | 1 | 0 | 1 | 0 |
| 2nd Data group ⊕ | 0 | 1 | 1 | 1 | 1 | 0 | 1 | 0 | 1 | 0 | 0 | 1 | 1 | 0 | 1 | 0 |
| 3rd Data group ⊕ | 1 | 1 | 1 | 0 | 1 | 1 | 1 | 0 | 1 | 1 | 1 | 0 | 0 | 0 | 1 | 1 |
| 4th Data group = | 1 | 0 | 0 | 0 | 0 | 0 | 0 | 0 | 0 | 1 | 1 | 1 | 1 | 0 | 1 | 0 |
| Spare Data group | 1 | 0 | 1 | 1 | 0 | 0 | 1 | 0 | 0 | 1 | 1 | 0 | 1 | 1 | 0 | 1 |

FIG. 4B

| | Index 0 | Index 1 | Index 2 | Index 3 | Index 4 | Index 5 | Index 6 | Index 7 | Index 8 | Index 9 | Index 10 | Index 11 | Index 12 | Index 13 | Index 14 | Index 15 |
|---|---|---|---|---|---|---|---|---|---|---|---|---|---|---|---|---|
| 1st Data group | 1 | 0 | 1 | 0 | 1 | 0 | 1 | 0 | 1 | 0 | 1 | 0 | 1 | 0 | 1 | 0 |
| 2nd Data group | 0 | 1 | 1 | 1 | 1 | 0 | 1 | 0 | 0 | 0 | 0 | 1 | 1 | 0 | 1 | 0 |
| 3rd Data group | 1 | 1 | 1 | 0 | 1 | 1 | 1 | 0 | 1 | 1 | 1 | 0 | 0 | 0 | 1 | 1 |
| 4th Data group | 1 | 0 | 0 | 0 | 0 | 0 | 0 | 0 | 1 | 1 | 1 | 1 | 1 | 0 | 1 | 0 |
| Spare Data group | 1 | 0 | 1 | 1 | 0 | 0 | 1 | 0 | 1 | 1 | 1 | 0 | 1 | 1 | 0 | 1 |

FIG. 6

| | Index 0 | Index 1 | Index 2 | Index 3 | Index 4 | Index 5 | Index 6 | Index 7 | Index 8 | Index 9 | Index 10 | Index 11 | Index 12 | Index 13 | Index 14 | Index 15 |
|---|---|---|---|---|---|---|---|---|---|---|---|---|---|---|---|---|
| 1st Data group | 1 | 0 | 1 | 0 | 1 | 0 | 1 | 0 | 1 | 0 | 1 | 0 | 1 | 0 | 1 | 0 |
| 1st Reliability | 1 | 1 | 1 | 1 | 1 | 0 | 1 | 0 | 1 | 1 | 1 | 0 | 0 | 1 | 0 | 0 |
| 2nd Data group | 0 | 1 | 1 | 1 | 1 | 0 | 1 | 0 | 1 | 0 | 0 | 1 | 1 | 0 | 1 | 0 |
| 2nd Reliability | 1 | 0 | 0 | 1 | 0 | 1 | 0 | 1 | 1 | 0 | 1 | 0 | 0 | 1 | 0 | 1 |
| 3rd Data group | 1 | 1 | 1 | 0 | 1 | 1 | 1 | 0 | 1 | 1 | 1 | 0 | 0 | 0 | 1 | 1 |
| 4th Data group | 1 | 0 | 0 | 0 | 0 | 0 | 0 | 0 | 1 | 1 | 1 | 1 | 1 | 0 | 1 | 0 |
| Spare Data group | 1 | 0 | 1 | 1 | 0 | 0 | 1 | 0 | 0 | 1 | 1 | 0 | 1 | 1 | 0 | 1 |

CONTROLLER AND OPERATION METHOD THEREOF

CROSS-REFERENCE TO RELATED APPLICATION

This application claims priority under 35 U.S.C. § 119(a) to Korean Patent Application No. 10-2018-0100117, filed on Aug. 27, 2018, which is incorporated herein by reference in its entirety.

BACKGROUND

1. Field

Various embodiments relate to a controller, and more particularly, to a controller for controlling a memory device.

2. Discussion of the Related Art

Recently, the paradigm for the computing environment has changed to ubiquitous computing in which computer systems can be used anytime anywhere. Therefore, the use of portable electronic devices such as mobile phones, digital cameras and notebook computers has rapidly increased. Such a portable electronic device generally uses a memory system having a memory device, that is, a data storage device. The data storage device is used as a main or secondary memory device of the portable electronic device.

Since the data storage device using a memory device has no mechanical driver, the data storage device has excellent stability and durability, high information access speed, and low power consumption. Examples of data storage devices providing such advantages include a universal serial bus (USB) memory device, a memory card having various interfaces, a solid state drive (SSD) and the like.

SUMMARY

Various embodiments are directed to a controller which can improve the reliability of a memory system by determining a recovery soft read voltage to maximize the number of bits which can be selectively recovered in the memory system, and an operation method thereof.

In an embodiment, a controller for controlling a memory device may include: a read control component suitable for controlling a recovery soft read operation of the memory device on bits contained in error correction-failed data groups, when error correction on data of a target data group and error correction on one or more of data of corresponding data groups failed; an error correction code (ECC) component suitable for performing the error correction, and performing a selective data recovery operation on the target data group depending on reliabilities of the respective bits, derived as a result of the recovery soft read operation; and a read bias determiner suitable for determining a recovery soft read voltage to maximize the number of bits recovered by the selective data recovery operation, among bits contained in the target data group.

In an embodiment, there is provided an operation method of a controller which controls a memory device. The operation method may include: controlling a recovery soft read operation of the memory device on bits contained in error correction-failed data groups, when error correction on data of a target data group and error correction on one or more of data of corresponding data groups failed; performing a selective data recovery operation on the target data group, depending on reliabilities of the respective bits, derived as a result of the recovery soft read operation; and determining a recovery soft read voltage to maximize the number of bits recovered by the selective data recovery operation, among bits contained in the target data group.

In an embodiment, memory system, comprising: a memory device; and a controller configured to: control the memory device to read data of a target data group into the controller, and perform a first error correction on the read data of the target data group, control the memory device to read data of other data groups corresponding to the target data group into the controller, and perform a second error correction on the read data of the other data groups, when the first error correction failed, and perform a selective data recovery operation on the target data group based on reliability information of bits in the target data group, when the second error correction failed.

BRIEF DESCRIPTION OF THE DRAWINGS

FIGS. 4A and 4B are diagrams illustrating a data recovery technique of the memory system in accordance with an embodiment.

FIGS. 5 and 6 are a flowchart and diagram respectively illustrating a selective data recovery operation of the memory system in accordance with an embodiment.

DETAILED DESCRIPTION

Various embodiments will be described in detail with reference to the accompanying drawings. The following description primarily focuses on portions required for understanding operations in accordance with the present embodiments. Description of well-known technical detail is omitted in order not to unnecessarily obscure features and aspects of the present embodiments.

In describing the embodiments in more detail with reference to the accompanying drawings, reference to "an embodiment," "another embodiment" or the like is not necessarily to only one embodiment, and different references to any such phrase are not necessarily to the same embodiment(s).

Figure 1:
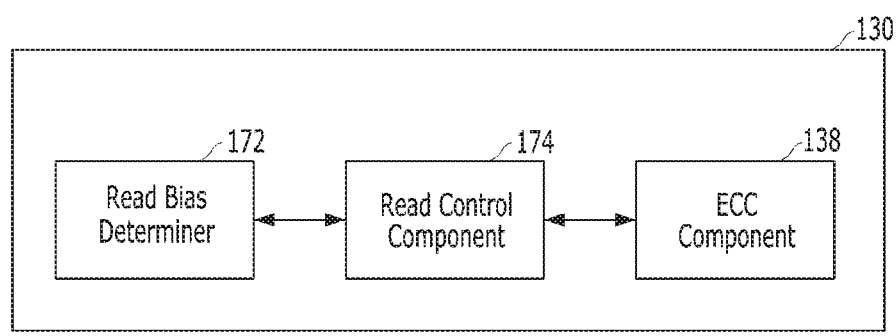
FIG. 1 is a schematic diagram illustrating the structure of a controller in accordance with an embodiment.

FIG. 1 schematically illustrates the structure of a controller 130 in accordance with an embodiment.

The controller 130 may control a memory device in response to a request from a host. For example, the controller 130 may provide data read from the memory device to the host, and store data provided from the host in the memory device. For this operation, the controller 130 may control various operations of the memory device, for example, read, write, program and erase operations.

The controller 130 in accordance with the present embodiment may include a read bias determiner 172, a read control component 174 and an error correction code (ECC) component 138.

The read control component 174 may control a read operation of the memory device. The read operation may include a hard read operation, a soft read operation and a recovery soft read operation which will be described below. The hard read operation may indicate an operation of the memory device to read data stored in a memory cell by applying a hard read voltage to a word line. The soft read operation may indicate an operation of the memory device to add reliability information on the read data by applying a soft read voltage to the word line.

The ECC component 138 may perform error correction on the data read from the memory device. Specifically, the ECC component 138 may correct an error in the read data, based on the data read through the hard read operation or the reliability information acquired through the soft read operation.

When an error in data read from a target data group to be read cannot be corrected through an error correction code, the ECC component 138 may perform an operation of acquiring data of data groups corresponding to the target data group, and recovering the data of the target data group based on the acquired data, for example, a chip-kill operation.

When the data of the target data group cannot be recovered due to an error correction failure in the data of the corresponding data groups, the ECC component 138 may obtain reliability information on bits contained in the corresponding data groups through an additional soft read operation, and then perform a selective data recovery operation on bits contained in the target data group based on the reliability information.

The ECC component 138 will be described in more detail with reference to FIG. 2, and the data recovery operation and the selective data recovery operation will be described in detail with reference to FIGS. 4A to 5.

The read bias determiner 172 in accordance with the present embodiment may determine the soft read voltage for performing the additional soft read operation. In this specification, the additional soft read operation for performing the selective data recovery operation is defined as the recovery soft read operation. The present embodiment provides a method capable of increasing an error correction probability through the selective data recovery operation by determining the recovery soft read voltage.

Figure 2:
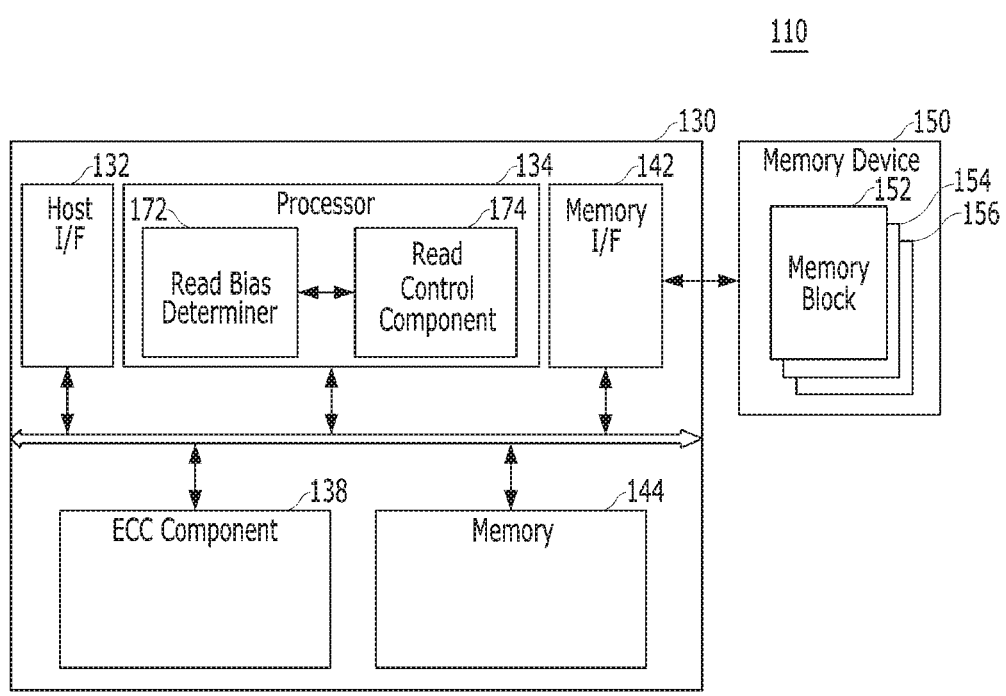
FIG. 2 is a schematic diagram illustrating the structure of a memory system including the controller in accordance with an embodiment.

FIG. 2 is a block diagram illustrating a data processing system 100 in accordance with an embodiment of the present invention.

Referring to FIG. 2, the data processing system 100 may include a host operatively coupled to a memory system 110.

The host may include any of various portable electronic devices such as a mobile phone, MP3 player and laptop computer, or any of various non-portable electronic devices such as a desktop computer, a game machine, a television (TV), and a projector.

The host may include at least one operating system (OS), which may manage and control overall functions and operations of the host, and provide operation between the host 102 and a user using the data processing system 100 or the memory system 110. The OS may support functions and operations corresponding to the use purpose and usage of a user. For example, the OS may be divided into a general OS and a mobile OS, depending on the mobility of the host. The general OS may be divided into a personal OS and an enterprise OS, depending on the environment of a user. For example, the personal OS configured to support a function of providing a service to general users may include Windows and Chrome, and the enterprise OS configured to secure and support high performance may include Windows server, Linux and Unix. Furthermore, the mobile OS configured to support a function of providing a mobile service to users and a power saving function of a system may include Android, iOS and Windows Mobile. The host may include a plurality of OSs, and execute an OS to perform an operation corresponding to a user's request on the memory system 110.

The memory system 110 may operate to store data for the host in response to a request of the host 102. Non-limiting examples of the memory system 110 include a solid state drive (SSD), a multi-media card (MMC), a secure digital (SD) card, a universal storage bus (USB) device, a universal flash storage (UFS) device, compact flash (CF) card, a smart media card (SMC), a personal computer memory card international association (PCMCIA) card and memory stick. The MMC may include an embedded MMC (eMMC), reduced size MMC (RS-MMC) and micro-MMC, and the. The SD card may include a mini-SD card and micro-SD card.

The memory system 110 may be embodied by any of various types of storage devices. Examples of such storage devices include, but are not limited to, volatile memory devices such as a DRAM dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM or ReRAM) and a flash memory. The flash memory may have a 3-dimensional (3D) stack structure.

The memory system 110 may include a controller 130 and a memory device 150. The memory device 150 may store data for the host 102, and the controller 130 may control data storage into the memory device 150.

The controller 130 and the memory device 150 may be integrated into a single semiconductor device, which may be included in any of the various types of memory systems exemplified above. For example, the controller 130 and the memory device 150 may be integrated as one semiconductor device to constitute a solid state drive (SSD). When the memory system 110 is used as an SSD, the operating speed of the host 102 connected to the memory system 110 can be improved. Alternatively, the controller 130 and the memory device 150 may be integrated as one semiconductor device to constitute a memory card such as a personal computer memory card international association (PCMCIA) card, compact flash (CF) card, smart media (SM) card, memory stick, multimedia card (MMC) including reduced size MMC (RS-MMC) and micro-MMC, secure digital (SD) card including mini-SD, micro-SD and SDHC, or universal flash storage (UFS) device.

Non-limiting application examples of the memory system 110 include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device that retains data stored therein even though power is not supplied. The memory device 150 may store data provided from the host 102 through a write operation, and provide data stored therein to the host 102 through a read operation. The memory device 150 may include a plurality of memory blocks 152, 154, 156 . . . , each of which may include a plurality of pages, and each of the pages may include a plurality of memory cells coupled to a word line. In an embodiment, the memory device 150 may be a flash memory. The flash memory may have a 3-dimensional (3D) stack structure.

The memory device 150 may include a plurality of memory blocks, which may include a single level cell (SLC) memory block storing 1 bit and/or a multi-level cell (MLC) memory block storing 2 or more bits of data. Particularly, the memory device 150 may include MLC memory blocks, each of which includes a plurality of pages that are realized by memory cells capable of storing two-bit data in one memory cell, but also other memory blocks with memory cells that each store more than two bits. For example, the memory device 150 may include triple level cell (TLC) memory blocks, each of which includes a plurality of pages that are realized by memory cells capable of storing three-bit data in one memory cell, quadruple level cell (QLC) memory blocks, each of which includes a plurality of pages that are realized by memory cells capable of storing four-bit data in one memory cell, and/or multiple level cell memory blocks, each of which includes a plurality of pages that are realized by memory cells capable of storing five or more-bit data in one memory cell.

The memory blocks 152, 154 and 156 may store the data transferred from the host 102 through a program operation, and transfer data stored therein to the host 102 through a read operation.

The memory device 150 may be embodied by a nonvolatile memory device having a 3D stack structure.

Since the structure of the memory device 150 will be described in detail later with reference to FIG. 3, further description of that aspect is omitted here.

The controller 130 may control the memory device 150 in response to a request from the host 102. For example, the controller 130 may provide data read from the memory device 150 to the host 102, and store data provided from the host 102 into the memory device 150. For this operation, the controller 130 may control read, write, program and erase operations of the memory device 150.

The controller 130 may include a host interface (I/F) 132, a processor 134, an error correction code (ECC) component 138, a memory I/F 142 such as a NAND flash controller (NFC), and a memory 144 all operatively coupled via an internal bus.

The host interface 132 may be configured to process a command and data of the host 102, and may communicate with the host 102 through one or more of various interface protocols such as universal serial bus (USB), multi-media card (MMC), peripheral component interconnect-express (PCI-e or PCIe), small computer system interface (SCSI), serial-attached SCSI (SAS), serial advanced technology attachment (SATA), parallel advanced technology attachment (PATA), enhanced small disk interface (ESDI) and integrated drive electronics (IDE).

The ECC component 138 may detect and correct an error contained in the data read from the memory device 150. In other words, the ECC component 138 may perform an error correction decoding process to the data read from the memory device 150 using an ECC code applied during an ECC encoding process. According to a result of the error correction decoding process, the ECC component 138 may output a signal, for example, an error correction success/fail signal. When the number of error bits is more than a threshold value of correctable error bits, the ECC component 138 may not correct the error bits, and may output an error correction fail signal.

The ECC component 138 may perform error correction through a coded modulation such as Low Density Parity Check (LDPC) code, Bose-Chaudhri-Hocquenghem (BCH) code, turbo code, Reed-Solomon code, convolution code, Recursive Systematic Code (RSC), Trellis-Coded Modulation (TCM) and/or Block coded modulation (BCM). However, the ECC component 138 is not limited to any specific technique or structure. As such, the ECC component 138 may include any and all circuits, modules, systems or devices for suitable error correction.

The memory I/F 142 may serve as a memory/storage interface for interfacing the controller 130 and the memory device 150 such that the controller 130 controls the memory device 150 in response to a request from the host 102. When the memory device 150 is a flash memory or specifically a NAND flash memory, the memory I/F 142 may generate a control signal for the memory device 150 and process data to be provided to the memory device 150 under the control of the processor 134. The memory I/F 142 may work as an interface (e.g., a NAND flash interface) for processing a command and data between the controller 130 and the memory device 150. Specifically, the memory I/F 142 may support data transfer between the controller 130 and the memory device 150.

The memory 144 may serve as a working memory of the memory system 110 and the controller 130, and store data for driving the memory system 110 and the controller 130. The controller 130 may control the memory device 150 to perform read, write, program and erase operations in response to a request from the host 102. The controller 130 may provide data read from the memory device 150 to the host 102, may store data provided from the host 102 into the memory device 150. The memory 144 may store data required for the controller 130 and the memory device 150 to perform these operations.

The memory 144 may be embodied by a volatile memory. For example, the memory 144 may be embodied by static random access memory (SRAM) or dynamic random access memory (DRAM), The memory 144 may be disposed within or externally to the controller 130. FIG. 1 shows the memory 144 disposed within the controller 130. In another embodiment, the memory 144 may be embodied by an external volatile memory having a memory interface transferring data between the memory 144 and the controller 130.

The processor 134 may control the overall operations of the memory system 110. The processor 134 may drive firmware to control the overall operations of the memory system 110. The firmware may be referred to as flash translation layer (FTL). Also, the processor 134 may be realized as a microprocessor or a central processing unit (CPU).

For example, the controller 130 may perform an operation requested by the host 102 in the memory device 150 through the processor 134. In other words, the controller 130 may perform a command operation corresponding to a command received from the host 102, or other source. The controller 130 may perform a foreground operation as the command operation corresponding to the command received from the host 102. For example, the controller 130 may perform a program operation corresponding to a write command, a read operation corresponding to a read command, an erase operation corresponding to an erase command, and a parameter set operation corresponding to a set parameter command or a set feature command.

Also, the controller 130 may perform a background operation on the memory device 150 through the processor 134. The background operation may include an operation of copying and processing data stored in some memory blocks among the memory blocks 152 to 156 into other memory blocks, e.g., a garbage collection (GC) operation, an operation of swapping between some of the memory blocks 152 to 156 or between the data of the memory blocks 152 to 156, e.g., a wear-leveling (WL) operation, an operation of storing the map data stored in the controller 130 in the memory blocks 152 to 156, e.g., a map flush operation, or an operation of managing bad blocks of the memory device 150, e.g., a bad block management operation of detecting and processing bad blocks among the memory blocks 152 to 156.

The read bias determiner 172 and the read control component 174 which have been described with reference to FIG. 1 may be implemented through a processor 134 described with reference to FIG. 2.

Figure 3:
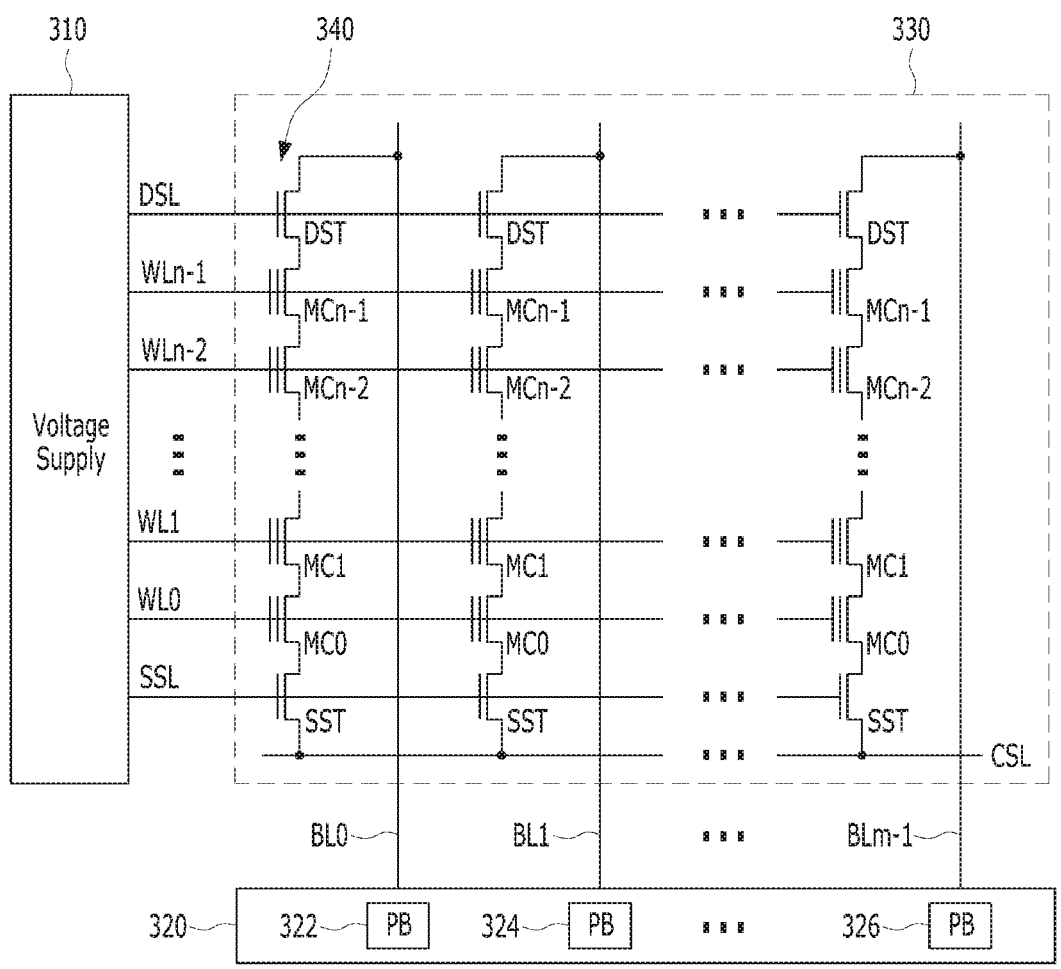
FIG. 3 is a diagram illustrating exemplary memory cell array circuits of memory blocks in the memory device of FIG. 2.

FIG. 3 schematically illustrates exemplary memory cell array circuits of memory blocks in the memory device of FIG. 2.

In accordance with an embodiment of the present invention, the memory device 150 is described as a non-volatile memory, such as a flash memory, e.g., a NAND flash memory. However, the memory device 150 may be realized as any of a Phase Change Random Access Memory (PCRAM), a Resistive Random Access Memory (RRAM or ReRAM), a Ferroelectric Random Access Memory (FRAM), a Spin Transfer Torque Magnetic Random Access Memory (STT-RAM or STT-MRAM).

Referring to FIG. 3, a memory block 330, representative of any of the plurality of memory blocks 152 to 156 included in the memory device 150 of the memory system 110, may include a plurality of cell strings 340 coupled to a plurality of corresponding bit lines BL0 to BLm−1, The cell string 340 of each column may include one or more drain select transistors DST and one or more source select transistors SST. Between the drain and ground select transistors DST and SST, a plurality of memory cells MC0 to MCn−1 may be coupled in series. In an embodiment, each of the memory cell transistors MC0 to MCn−1 may be embodied by an MLC capable of storing data information of a plurality of bits. Each of the cell strings 340 may be electrically coupled to a corresponding bit line among the plurality of bit lines BL0 to BLm−1. For example, as illustrated in FIG. 3, the first cell string is coupled to the first bit line BL0, and the last cell string is coupled to the last bit line BLm−1. For reference, in FIG. 3, 'DSL' denotes a drain select line, 'SSL' denotes a source select line, and 'CSL' denotes a common source line.

Although FIG. 3 illustrates NAND flash memory cells, the invention is not limited in this way. It is noted that the memory cells may be NOR flash memory cells, or hybrid flash memory cells including two or more types of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply 310 which provides word line voltages including a program voltage, a read voltage and a pass voltage to supply to the word lines according to an operation mode. The voltage generation operation of the voltage supply 310 may be controlled by a control circuit (not illustrated). Under the control of the control circuit, the voltage supply 310 may select one of the memory blocks (or sectors) of the memory cell array, select one of the word lines of the selected memory block, and provide the word line voltages to the selected word line and the unselected word lines as may be needed.

The memory device 150 may include a read and write (read/write) circuit 320 which is controlled by the control circuit. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

The memory device 150 may be embodied by a two-dimensional (2D) or three-dimensional (3D) memory device. Particularly, the memory device 150 may be embodied by a nonvolatile memory device having a 3D stack structure.

Each memory block 330 included in the memory device 150 may include a plurality of NAND strings NS that are extended in the second direction, and a plurality of NAND strings NS (not shown) that are extended in the first direction and the third direction. Each of the NAND strings NS may be coupled to a bit line BL, at least one string selection line SSL, at least one ground selection line GSL, a plurality of word lines WL, at least one dummy word line DWL (not shown), and a common source line CSL, and each of the NAND strings NS may include a plurality of transistor structures TS (not shown).

FIGS. 4A and 4B are diagrams illustrating a data recovery technique of the memory system 110 in accordance with an embodiment.

The ECC component 138 may not correct an error in data read from the memory device 150 even through an error correction code. In order to recover the data in which the error is not corrected, the memory device 150 may further store a spare data group including only parity bits of a plurality of user data groups in advance. For example, the memory device 150 may store a spare data group composed of bits which are calculated by performing an XOR operation on bits of the respective user data groups at the same positions. FIG. 4A illustrates bits stored in 1st to 4th data groups as four user data groups and bits stored in a spare data group.

Among these groups, a data group including data to be read may be referred to as a target data group, and the other data groups excluding the target data group may be referred to as data groups corresponding to the target data group or corresponding data groups.

When the ECC component 138 failed to correct an error in data of the target data group, the ECC component 138 may read data of the corresponding data groups and perform error correction on the read data. Then, the ECC component 138 may perform a set or predetermined operation, for example, an XOR operation, on bits of the corresponding data groups at the same positions, thereby recovering the data of the target data group. FIG. 4B illustrates that the ECC component 138 can recover the 1st data group, which is the target data group, by performing an XOR operation on data of the corresponding data groups, i.e. the 2nd to 4th data groups and the spare data groups, when having failed to correct an error in data of the 1st data group.

When the corresponding data groups include error correction-failed data, the ECC component 138 cannot use the above-described data recovery technique. In this case, the ECC component 138 can recover some data of the target data group by performing a selective data recovery operation.

Figure 5:
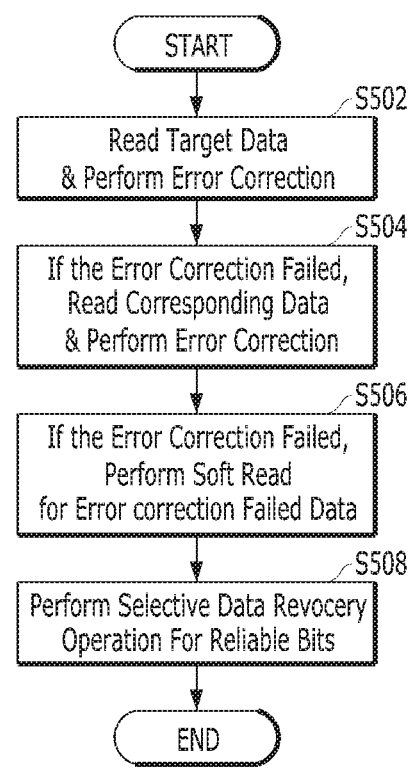

FIGS. 5 and 6 are a flowchart and diagram respectively illustrating the selective data recovery operation of the memory system 110 in accordance with an embodiment.

At step S502, the read control component 174 may control the memory device 150 to read the data of the target data group. The memory device 150 may perform a read operation in response to the control, and read the data into the controller 130 through the memory interface 142. The ECC component 138 may perform error correction on the read data.

If the error correction failed because error bits of a set number or more were detected from the data of the target data group, the ECC component 138 may provide an error correction fail signal to the read control component 174 at step S504. The read control component 174 may control the memory device 150 to read data of the plurality of corresponding data groups in response to the error correction fail signal for the target data group. When the memory device 150 reads data into the controller 130 in response to the control, the ECC component 138 may perform error correction on the read data, i.e., the data of the corresponding data groups.

If the error correction on the data of the corresponding data groups failed, the ECC component 138 cannot perform the data recovery operation, and may perform a selective data recovery operation on the target data group as shown in step S508.

If the error correction on one or more of the data of the corresponding data groups failed, the ECC component 138 may provide the error correction fail signal to the read control component 174 at step S506. The read control component 174 may control the memory device 150 to perform a recovery soft read operation on the error correction-failed data in response to the error correction fail signal for the corresponding data groups. The error correction-failed data may include the error correction-failed data of the target data group and the error correction-failed data among the data of the corresponding data groups.

FIG. 6 illustrates data read from the plurality of data groups in the memory system 110 and reliability information acquired through the recovery soft read operation, in the form of a table structure.

The table illustrated in FIG. 6 may include 1st to 4th data groups represented by 1st to 4th Data Groups and a spare data group represented by Spare Data Group as its fields, and include corresponding bit positions as indexes represented by Index 0 to Index 15. The entries of the respective fields may be filled with bit values corresponding to read results for the data of the respective data groups.

In the example of FIG. 6, the 1st data group may be set to the target data group, and the 2nd to 4th data groups and the spare data group may be set to the plurality of corresponding data groups. FIG. 6 is based on the supposition that error correction on the data of the 1st data group failed, and error correction on the data of the 2nd data group among the data of the corresponding data groups failed. Furthermore, FIG. 6 is based on the supposition that error correction on the data of the 3rd and 4th data groups and the spare data group succeeded.

The table illustrated in FIG. 6 may further include 1st reliability information (1st Reliability) and 2nd reliability information (2nd reliability) on the data of the 1st and 2nd data groups, acquired through the recovery soft read operation, as its fields. In the table, a bit corresponding to the reliability information value '1' indicates a reliable bit, and a bit corresponding to the reliability information value '0' indicates an unreliable bit. Since the error correction on the data of the 3rd and 4th data groups and the spare data group succeeded, bits contained in the data are all reliable bits. In FIG. 6, shaded entries visually indicate unreliable bits.

Referring back to FIG. 5, the ECC component 138 may perform a selective data recovery operation on the target data group based on the reliability information at step S508.

Referring back to FIG. 6, bits corresponding to the 1st reliability information value '1' among the bits contained in the 1st data group are reliable bits. Therefore, a data recovery operation may not be performed on the corresponding bits. In the example of FIG. 6, the ECC component 138 may not perform a data recovery operation on the bits corresponding to the 0th to 4th indexes, the 6th index, the 8th to 10th indexes and the 13th index, among the bits contained in the 1st data group.

Since the bits corresponding to the 1st reliability information value '0' among the bits contained in the 1st data group are unreliable bits, the ECC component 138 needs to perform a data recovery operation on the corresponding bits. The ECC component 138 may perform the data recovery operation on the unreliable bits, when the corresponding bits of the corresponding data groups are all reliable bits.

In the example of FIG. 6, since the 5th index value of the 1st reliability information is '0', the bit corresponding to the 5th index in the 1st data group is an unreliable bit. Since the 5th index value of the 2nd reliable information is '1', the bit corresponding to the 5th index in the 2nd data group is a reliable bit. Since the error correction on the data of the 3rd and 4th data groups and the spare data group succeeded, the bits corresponding to the 5th indexes of the respective data groups are reliable bits. Therefore, the ECC component 138 may perform an XOR operation on the bits corresponding to the 5th indexes of the plurality of corresponding data groups, for example, '0', '1', '0' and '0', thereby recovering the value of the bit corresponding to the 5th index of the 1st data group to '1'. Similarly, the ECC component 138 may perform a data recovery operation on the bits corresponding to the 7th and 15th indexes.

Referring to the 1st reliability information, the bits corresponding to the 11th, 12th and 14th indexes in the 1st data group are unreliable bits. Referring to the 2nd reliability information, the corresponding bits of the 2nd data group are also unreliable bits. Therefore, the ECC component 138 cannot perform a data recovery operation on the bits corresponding to the 11th, 12th and 14th indexes.

In short, the ECC component 138 may perform the selective data recovery operation on the target data group by performing the data recovery operation on unreliable bits among the bits contained in the target data group, when the corresponding bits contained in the plurality of corresponding data groups are all reliable bits.

In an embodiment, the ECC component 138 may further perform error correction on the data of the target data group, on which the selective data recovery operation has been completed, using an error correction code.

In accordance with the present embodiment, the read bias determiner 172 may determine a recovery soft read voltage to maximize the number of bits corresponding to the case in which the selective data recovery operation can be performed, among the bits of the target data group. In this case, the number of bits recovered through the selective data recovery operation can be maximized to thereby improve the reliability of the memory system 110.

Figure 7:
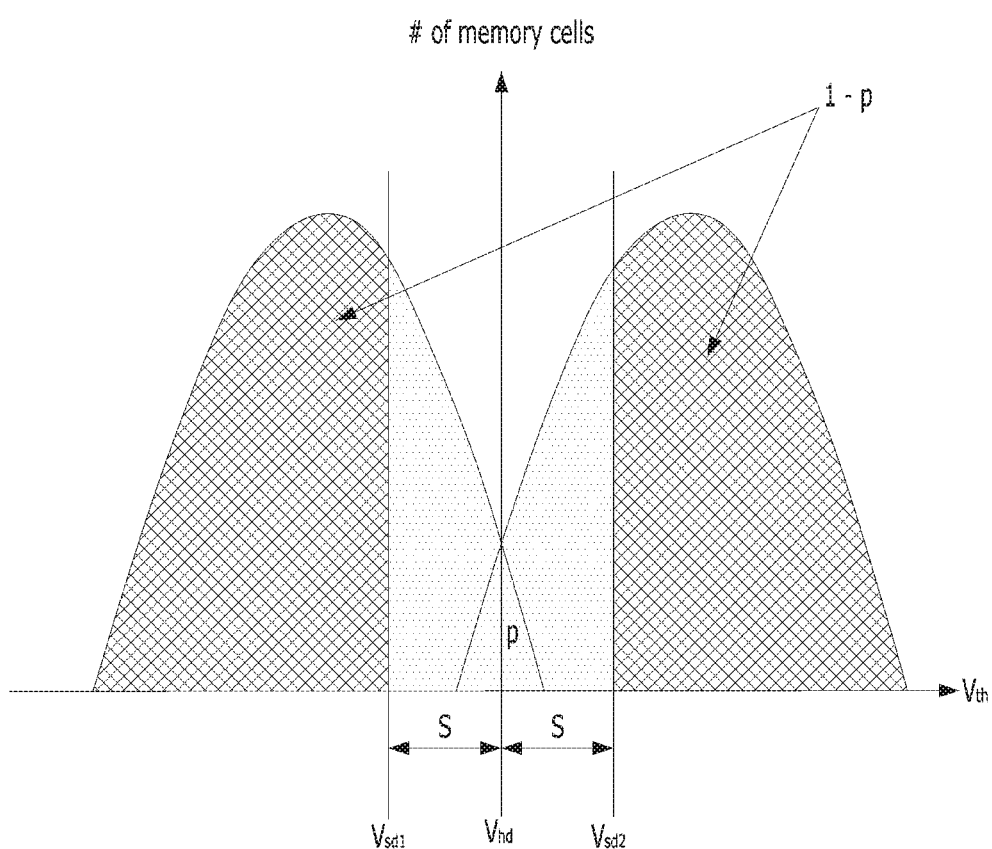
FIGS. 7 and 8 are diagrams for describing factors to determine a recovery soft read voltage in accordance with an embodiment.
Figure 8:
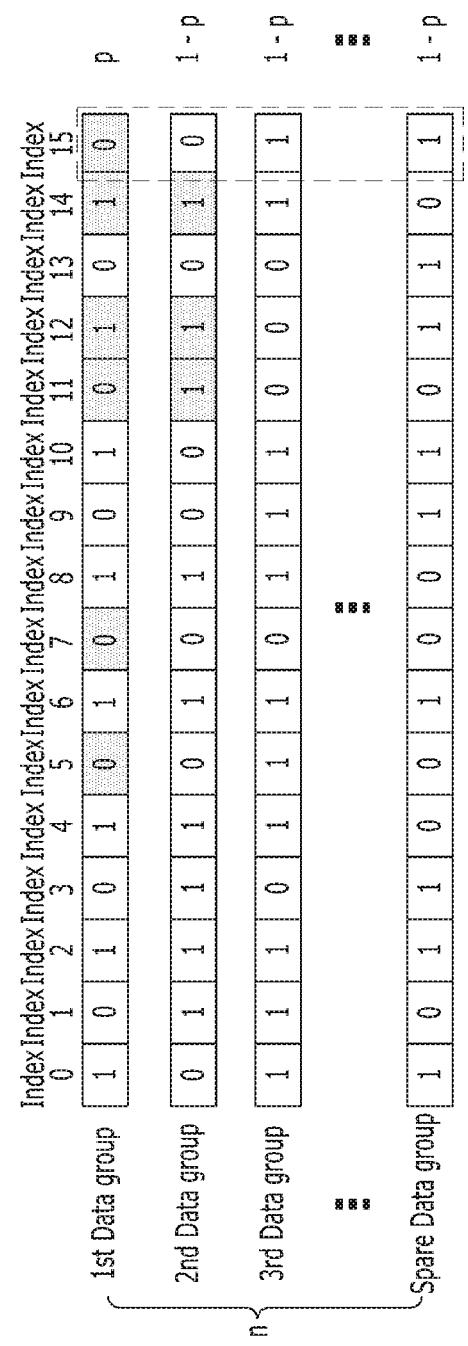

FIGS. 7 and 8 are diagrams illustrating factors to determine the recovery soft read voltage.

FIG. 7 is a graph illustrating threshold voltage distributions of memory cells, a hard read voltage $V_{hd}$ and 1st and 2nd recovery soft read voltages $V_{sd1}$ and $V_{sd2}$. In the graph, the horizontal axis indicates the threshold voltages of the respective memory cells, and the vertical axis indicates the numbers of memory cells having the corresponding threshold voltages. FIG. 7 illustrates threshold voltage distributions of single level cells. However, the present invention may also be applied to a memory device capable of storing a plurality of bits in one memory cell.

Each of the 1st and 2nd recovery soft read voltages $V_{sd1}$ and $V_{sd2}$ may have a difference corresponding to a set or predetermined step size S from the hard read voltage $V_{hd}$. When the threshold voltage of a memory cell is between the 1st and 2nd recovery soft read voltages $V_{sd1}$ and $V_{sd2}$, the corresponding bit may be determined to be an unreliable bit. When the threshold voltage of a memory cell is located in the other regions, the corresponding bit may be determined to be a reliable bit.

In this specification, the probability that a certain memory cell is an unreliable memory cell when the recovery soft read operation has been performed on the certain memory cell may be defined as an unreliability probability p.

FIG. 8 illustrates a plurality of data groups. As described above, the selective data recovery operation may be performed on a certain bit of the target data group, only when the corresponding bit is an unreliable bit and the corresponding bits of the corresponding data groups are all reliable bits. According to the definition of the unreliability probability p, the probability that a certain bit is an unreliable bit is p, and the probability that the certain bit is a reliable bit is 1-p. In n data groups composed of (n−1) user data groups and one spare data group, the probability that the selective data recovery operation is performed on each bit of the target data group is $p(1-p)^{n-1}$.

Figure 9:
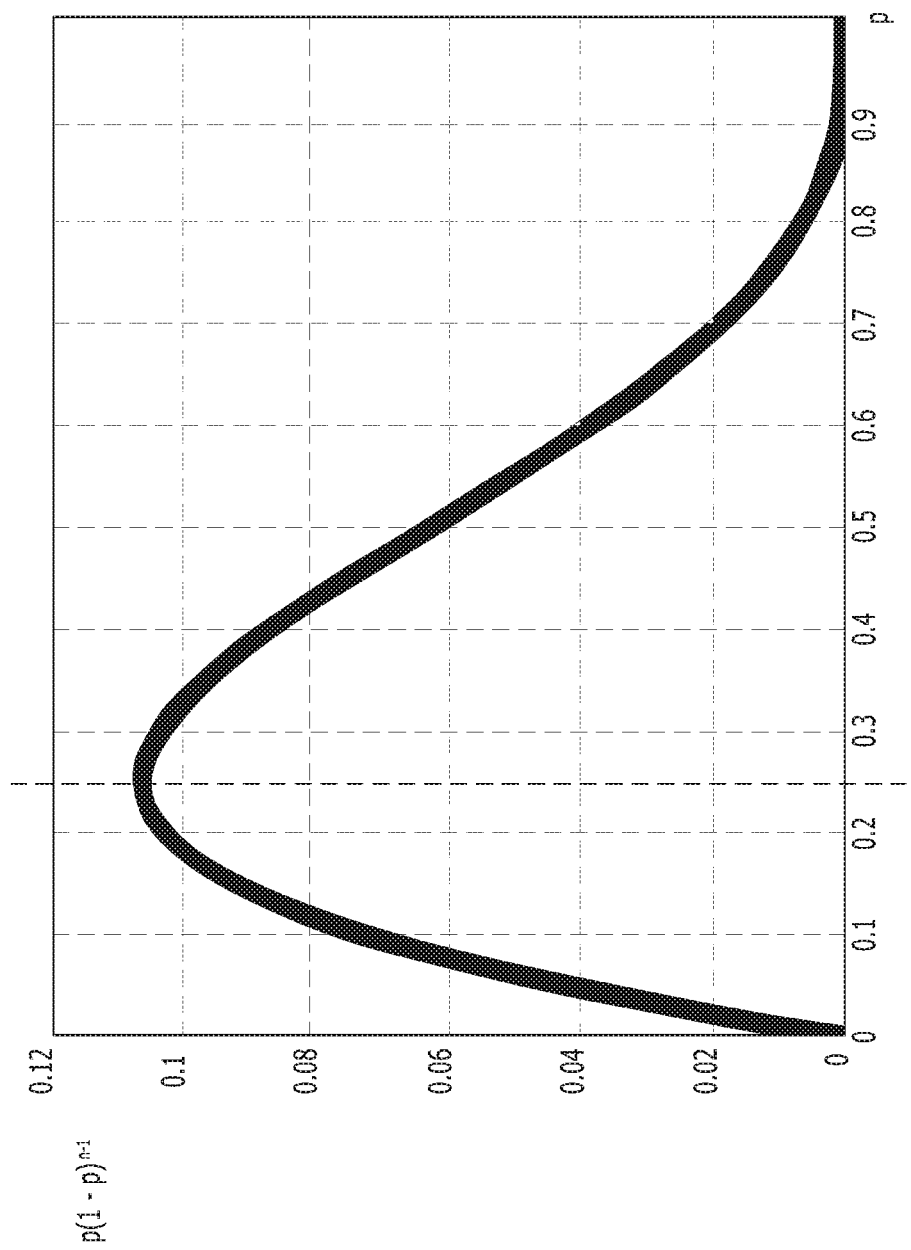
FIGS. 9 and 10 are graphs illustrating the case in which the probability that the selective data recovery operation is performed is maximized.
Figure 10:
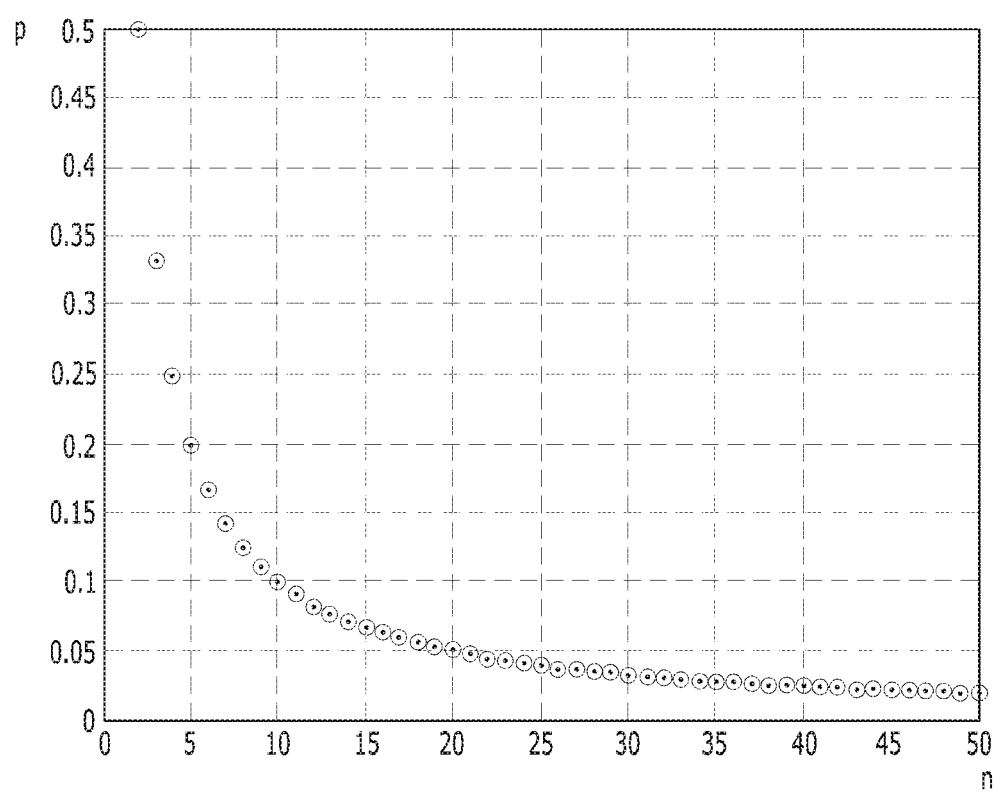

FIGS. 9 and 10 are graphs illustrating the case in which the probability that the selective data recovery operation is performed is maximized.

The graph of FIG. 9 indicates the probability $p(1-p)^{n-1}$ that the selective data recovery operation is performed, based on the unreliability probability p, when n (the number of data groups) is 4. The graph of FIG. 9 shows that there is an unreliability probability p to maximize the probability that the selective data recovery operation is performed, when n is set.

The graph of FIG. 10 indicates the unreliability probability p at which the probability that the selective data recovery operation is performed is maximized, depending on n, i.e., the number of data groups. The graph of FIG. 10 shows that the unreliability probability p at which the probability that the selective data recovery operation is performed is maximized can be determined according to the number of data groups, n.

Figure 11:
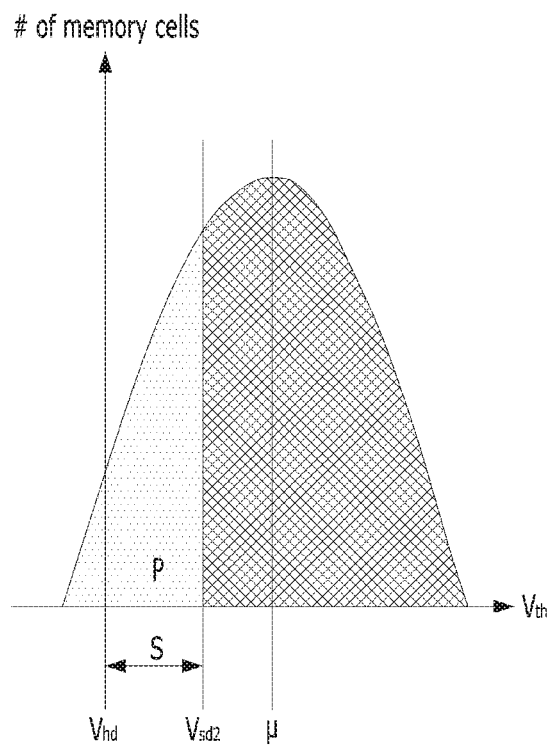
FIG. 11 is a graph illustrating a method for determining a recovery soft read voltage according to an unreliability probability.

FIG. 11 is a graph illustrating a method for determining a recovery soft read voltage according to the unreliability probability p.

In FIG. 11, a method for determining a recovery soft read voltage when a threshold voltage distribution of memory cells follows a normal distribution is described as an example. FIG. 11 illustrates a threshold voltage distribution of memory cells which are programmed to have the same value, for example, a logical value '0'.

The read bias determiner 172 may determine the step size s to maximize the number of bits recovered by the selective data recovery operation, depending on the average and standard deviation of the threshold voltages.

Specifically, the read bias determiner 172 may determine the step size s to maximize the probability that the bits contained in the target data group are unreliable bits and the corresponding bits contained in the corresponding data groups are all reliable bits, based on the number of the data groups including the target data group and the corresponding data groups. In other words, the read bias determiner 172 may determine the step size s which satisfies the unreliability probability p at which the value of $p(1-p)^{n-1}$ is maximized.

Specifically, the read bias determiner 172 may calculate the step size s based on the unreliability probability p, the hard read voltage $V_{hd}$, the average $\mu$ and the standard deviation $\sigma$ through the following equation:

$$s = \mu - \sigma Q^{-1}(p) - v_{hd}.$$

Here, the function $Q^{-1}$ is the inverse of a Q-function for calculating a tail probability in the normal distribution. When the voltage distribution of the memory cells is not significantly changed, the average $\mu$ and the standard deviation $\sigma$ may be considered as constants. The hard read voltage $V_{hd}$ indicating a hard read voltage for each of error correction-failed data groups may be determined by the read bias determiner 172. Therefore, the hard read voltage $V_{hd}$ may be known to the read bias determiner 172.

In an embodiment, the value of the function $Q^{-1}$ may be either derived through an operation of the read bias determiner 172, or derived from a table stored in the memory 144.

The read bias determiner 172 may calculate the 1st and 2nd recovery soft read voltages $V_{sd1}$ and $V_{sd2}$ using the hard read voltage and the step size. For example, the read bias determiner 172 may calculate the 2nd recovery soft read voltage $V_{sd2}$ by adding the hard read voltage $V_{hd}$ and the step size s. Furthermore, the read bias determiner 172 may calculate the 1st recovery soft read voltage (not illustrated) by subtracting the step size from the hard read voltage.

Furthermore, it may be assumed that the average and standard deviation of the threshold voltage distribution are equal for each of the data groups. In an embodiment, however, each of the data groups may have a different average and standard deviation of threshold voltage distribution. In this case, the read bias determiner 172 may determine a different recovery soft read voltage for each of the data groups.

The present invention is not limited to the case in which a threshold voltage distribution of memory cells follows a normal distribution. For example, the read bias determiner 172 may estimate the threshold voltage distribution of the memory cells based on data read by applying various read voltages to a word line. The read bias determiner 172 may determine a recovery soft read voltage based on the estimated distribution and the unreliability probability p.

In this specification, the selective data recovery technique in the case where error correction on data read by a hard read voltage, i.e., hard decoding failed, has been described as an example, but the present invention is not limited thereto. When error correction on data read by a soft read voltage, i.e., soft decoding, failed, the ECC component 138 may correct a log likelihood ratio (LLR) by performing a selective data recovery operation, and then perform soft decoding on the data of the target data group using the corrected LLR. The present embodiment may be applied to maximize the probability that the selective data recovery operation is performed, even when the selective data recovery technique is applied in the case where the soft decoding failed.

In accordance with embodiments of the present invention, the read bias determiner 172 may determine the recovery soft read voltage to maximize the number of bits recovered by the selective data recovery operation. Therefore, the reliability of the memory system 110 can be improved.

FIGS. 12 to 20 are diagrams schematically illustrating application examples of the data processing system of FIGS. 1 to 11 according to various embodiments.

Figure 12:
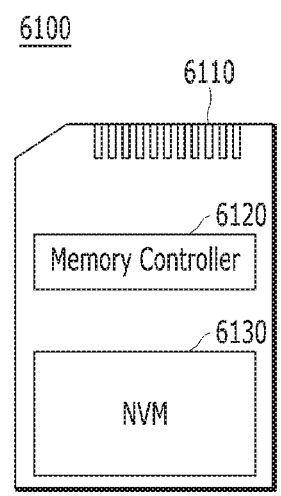
FIGS. 12 to 20 are diagrams schematically illustrating exemplary applications of a data processing system including a memory system in accordance with embodiments.

FIG. 12 is a diagram schematically illustrating the data processing system including the controller in accordance with an embodiment. FIG. 12 schematically illustrates a memory card system 6100 to which the controller is applied.

Referring to FIG. 12, the memory card system 6100 may include a memory controller 6120, a memory device 6130 and a connector 6110.

More specifically, the memory controller 6120 may be connected to the memory device 6130 embodied by a nonvolatile memory (NVM), and configured to access the memory device 6130. For example, the memory controller 6120 may be configured to control read, write, erase and background operations of the memory device 6130. The memory controller 6120 may be configured to provide an interface between the memory device 6130 and a host (not shown), and drive firmware for controlling the memory device 6130. That is, the memory controller 6120 may correspond to the controller 130 of the memory system 110 described with reference to FIG. 1, and the memory device 6130 may correspond to the memory device 150 of the memory system 110 described with reference to FIG. 1.

Thus, as shown in FIG. 1, the memory controller 6120 may include a random access memory (RAM), a processor, a host interface, a memory interface and an error correction component.

The memory controller 6120 may communicate with an external device, for example the host 102 of FIG. 1, through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), wireless fidelity (Wi-Fi or WiFi) and Bluetooth. Thus, the memory system and the data processing system may be applied to wired and/or wireless electronic devices, particularly mobile electronic devices.

The memory device 6130 may be implemented by a nonvolatile memory. For example, the memory device 6130 may be implemented by any of various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM).

The memory controller 6120 and the memory device 6130 may be integrated into a single semiconductor device. For example, the memory controller 6120 and the memory device 6130 may be integrated to form a solid-state driver (SSD). Alternatively, the memory controller 6120 and the memory device 6130 may be integrated to form a memory card such as a PC card (e.g., Personal Computer Memory Card International Association (PCMCIA)), a compact flash (CF) card, a smart media card (e.g., SM and SMC), a memory stick, a multimedia card (e.g., MMC, RS-MMC, MMCmicro and eMMC), an secured digital (SD) card (e.g., SD, miniSD, microSD and SDHC) and/or a universal flash storage (UFS).

Figure 13:
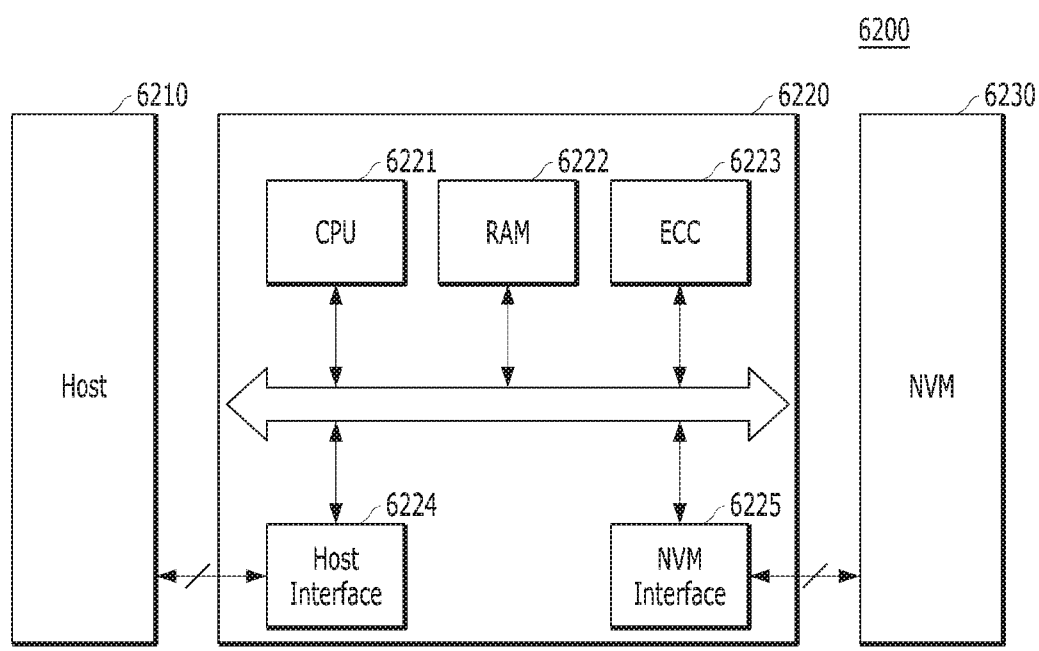

FIG. 13 is a diagram schematically illustrating another example of a data processing system 6200 including the controller in accordance with an embodiment.

Referring to FIG. 13, the data processing system 6200 may include a memory device 6230 having one or more nonvolatile memories (NVMs) and a memory controller 6220 for controlling the memory device 6230. The data processing system 6200 may serve as a storage medium such as a memory card (CF, SD, micro-SD or the like) or USB device, as described with reference to FIG. 1. The memory device 6230 may correspond to the memory device 150 in the memory system 110 illustrated in FIG. 1, and the memory controller 6220 may correspond to the controller 130 in the memory system 110 illustrated in FIG. 1.

The memory controller 6220 may control a read, write or erase operation on the memory device 6230 in response to a request of the host 6210, and the memory controller 6220 may include one or more central processing units (CPUs) 6221, a buffer memory such as a random access memory (RAM) 6222, an error correction code (ECC) circuit 6223, a host interface 6224 and a memory interface such as an NVM interface 6225.

The CPU 6221 may control overall operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the memory device 6230 to operate at high speed.

The ECC circuit 6223 may correspond to the ECC component 138 of the controller 130 illustrated in FIG. 1. As described with reference to FIG. 1, the ECC circuit 6223 may generate an error correction code (ECC) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. The ECC circuit 6223 may correct an error using the parity bit. For example, as described with reference to FIG. 1, the ECC circuit 6223 may correct an error using Low Density Parity Check (LDPC) code, Bose-Chaudhri-Hocquenghem (BCH) code, turbo code, Reed-Solomon code, convolution code, Recursive Systematic Code (RSC) or coded modulation such as Trellis-Coded Modulation (TCM) or Block coded modulation (BCM).

The memory controller 6220 may exchange data with the host 6210 through the host interface 6224, and exchange data with the memory device 6230 through the NVM interface 6225. The host interface 6224 may be connected to the host 6210 through a parallel advanced technology attachment (PATA) bus, serial advanced technology attachment (SATA) bus, small computer system interface (SCSI), universal serial bus (USB), peripheral component interconnect-express (PCIe) or NAND interface. The memory controller 6220 may have a wireless communication function with a mobile communication protocol such as wireless fidelity (WiFi) or Long Term Evolution (LTE). The memory controller 6220 may be connected to an external device, for example, the host 6210 or another external device, and then transmit and/or receive data to and/or from the external device. In particular, as the memory controller 6220 is configured to communicate with the external device through one or more of various communication protocols, the memory system and the data processing system may be applied to wired and/or wireless electronic devices, particularly a mobile electronic device.

Figure 14:
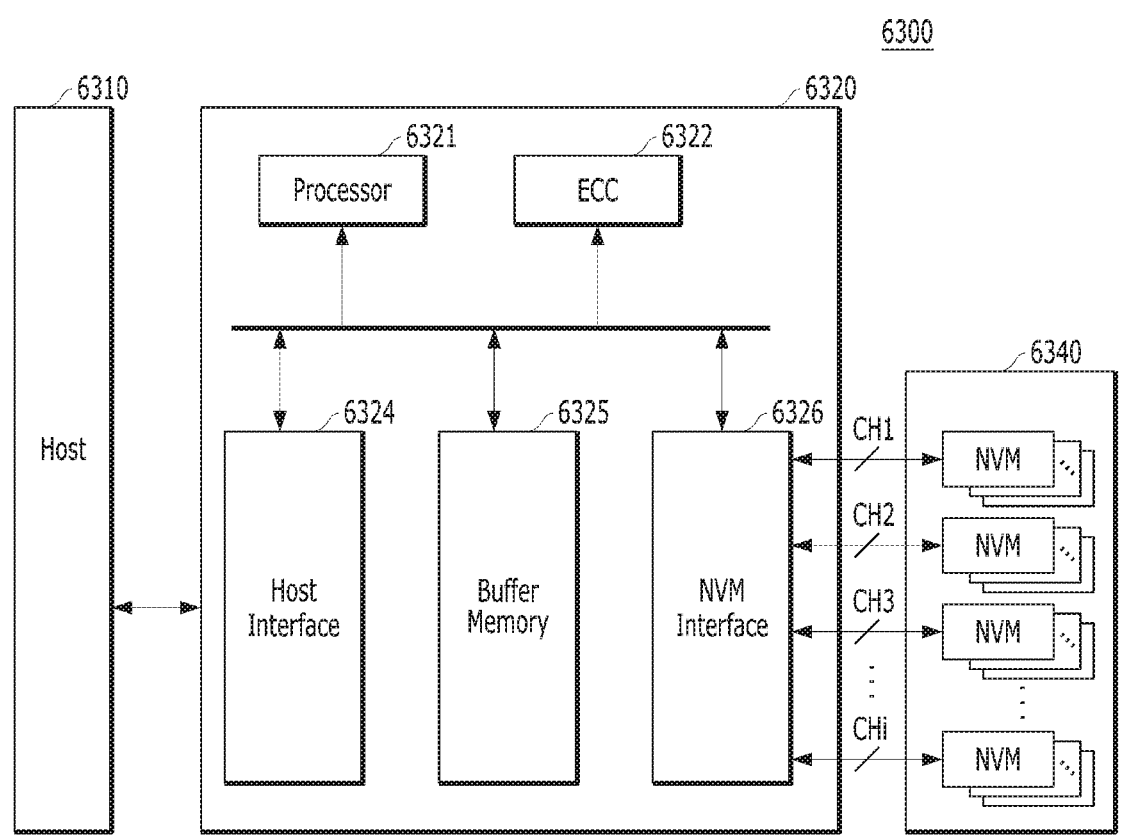

FIG. 14 is a diagram schematically illustrating another example of the data processing system including the controller in accordance with an embodiment. FIG. 14 schematically illustrates a solid state drive (SSD) 6300 to which the memory system may be applied.

Referring to FIG. 14, the SSD 6300 may include a controller 6320 and a memory device 6340 including a plurality of nonvolatile memories (NVMs). The controller 6320 may correspond to the controller 130 in the memory system 110 of FIG. 1, and the memory device 6340 may correspond to the memory device 150 in the memory system of FIG. 1.

More specifically, the controller 6320 may be connected to the memory device 6340 through a plurality of channels CH1 to CHi. The controller 6320 may include one or more processors 6321, an error correction code (ECC) circuit 6322, a host interface 6324, a buffer memory 6325 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as dynamic random access memory (DRAM), synchronous DRAM (SDRAM), double data rate (DDR) SDRAM, low power DDR (LPDDR) SDRAM and graphics RAM (GRAM) or nonvolatile memories such as ferroelectric RAM (FRAM), resistive RAM (RRAM or ReRAM), spin-transfer torque magnetic RAM (STT-MRAM) and phase-change RAM (PRAM). For convenience of description, FIG. 14 illustrates that the buffer memory 6325 is disposed in the controller 6320. However, the buffer memory 6325 may external to the controller 6320.

The ECC circuit 6322 may calculate an error correction code (ECC) value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIG. 1 is applied may be provided to embody a data processing system, for example, a redundant array of independent disks (RAID) system. The RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 15:
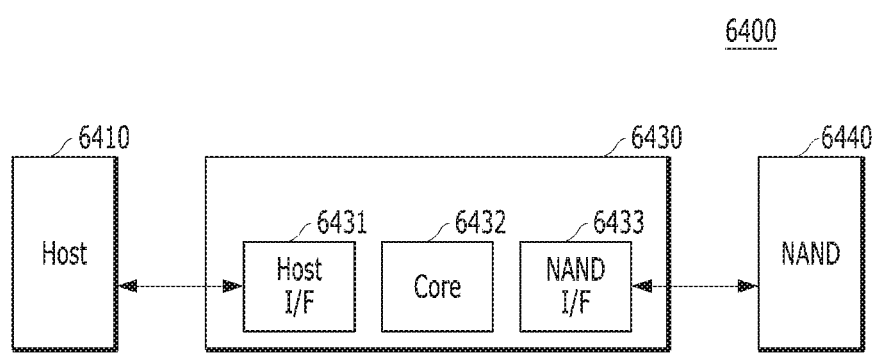

FIG. 15 is a diagram schematically illustrating another example of the data processing system including the controller in accordance with an embodiment. FIG. 15 schematically illustrates an embedded Multi-Media Card (eMMC) 6400 to which the memory system may be applied.

Referring to FIG. 15, the eMMC 6400 may include a controller 6430 and a memory device 6440 embodied by one or more NAND flash memories. The controller 6430 may correspond to the controller 130 in the memory system 110 of FIG. 1, and the memory device 6440 may correspond to the memory device 150 in the memory system 110 of FIG. 1.

More specifically, the controller 6430 may be connected to the memory device 6440 through a plurality of channels. The controller 6430 may include one or more cores 6432, a host interface (I/F) 6431 and a memory interface, for example, a NAND interface (I/F) 6433.

The core 6432 may control overall operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, Ultra High Speed (UHS)-I and/or UHS-II interface.

Each of the memory controller 6120, the memory controller 6220, the controller 6320 and the controller 6430 may maximize the number of bits recovered by the selective data recovery operation, by determining a recovery soft read voltage using at least one processor. Therefore, the reliability of the memory system 110 can be improved.

FIGS. 16 to 19 are diagrams schematically illustrating other examples of the data processing system including the memory system in accordance with one or more embodiments. FIGS. 16 to 19 schematically illustrate universal flash storage (UFS) systems to which the memory system may be applied. The memory systems in accordance with the various embodiments described with reference to FIGS. 1 to 15 may be applied to the UFS described with reference to FIGS. 16 to 19.

Referring to FIGS. 16 to 19, the UFS systems 6500, 6600, 6700 and 6800 may include hosts 6510, 6610, 6710 and 6810, UFS devices 6520, 6620, 6720 and 6820 and UFS cards 6530, 6630, 6730 and 6830, respectively. The hosts 6510, 6610, 6710 and 6810 may serve as application processors of wired and/or wireless electronic devices or particularly mobile electronic devices, the UFS devices 6520, 6620, 6720 and 6820 may serve as embedded UFS devices. The UFS cards 6530, 6630, 6730 and 6830 may serve as external embedded UFS devices or removable UFS cards.

The hosts 6510, 6610, 6710 and 6810, the UFS devices 6520, 6620, 6720 and 6820 and the UFS cards 6530, 6630, 6730 and 6830 in the respective UFS systems 6500, 6600, 6700 and 6800 may communicate with external devices, for example, wired and/or wireless electronic devices or particularly mobile electronic devices through UFS protocols. The UFS devices 6520, 6620, 6720 and 6820 and the UFS cards 6530, 6630, 6730 and 6830 may be embodied by the memory system 110 illustrated in FIG. 1. For example, in the UFS systems 6500, 6600, 6700 and 6800, the UFS devices 6520, 6620, 6720 and 6820 may be embodied in the form of the data processing system 6200, the SSD 6300 or the eMMC 6400 described with reference to FIGS. 9 to 11, and the UFS cards 6530, 6630, 6730 and 6830 may be embodied in the form of the memory card system 6100 described with reference to FIG. 12.

Furthermore, in the UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720 and 6820 and the UFS cards 6530, 6630, 6730 and 6830 may communicate with each other through various protocols other than the UFS protocol, for example, universal storage bus (USB) Flash Drives (UFDs), multi-media card (MMC), secure digital (SD), mini-SD, and micro-SD.

Figure 16:
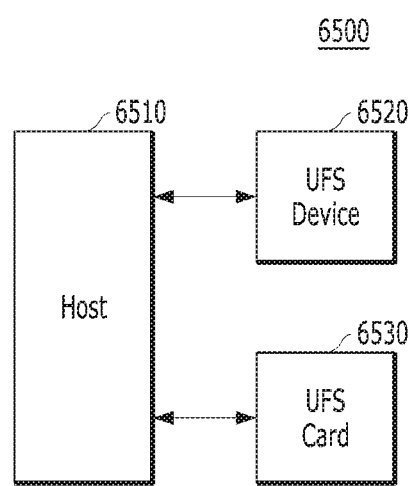

In the UFS system 6500 illustrated in FIG. 16, each of the host 6510, the UFS device 6520 and the UFS card 6530 may include UniPro. The host 6510 may perform a switching operation in order to communicate with the UFS device 6520 and the UFS card 6530, In particular, the host 6510 may communicate with the UFS device 6520 or the UFS card 6530 through link layer switching, for example, L3 switching at the UniPro. The UFS device 6520 and the UFS card 6530 may communicate with each other through link layer switching at the UniPro of the host 6510. In the embodiment of FIG. 16, the configuration in which one UFS device 6520 and one UFS card 6530 are connected to the host 6510 is illustrated as an example. However, a plurality of UFS devices and UFS cards may be connected in parallel or in the form of a star to the host 6510, and a plurality of UFS cards may be connected in parallel or in the form of a star to the UFS device 6520 or connected in series or in the form of a chain to the UFS device 6520.

Figure 17:
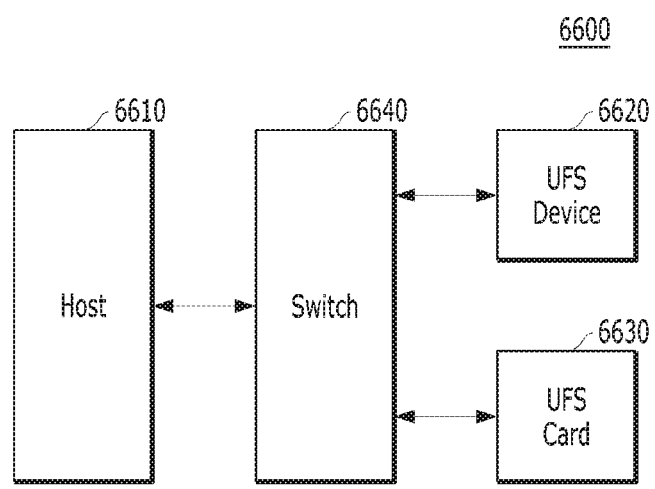

In the UFS system 6600 illustrated in FIG. 17, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In the embodiment of FIG. 17, the configuration in which one UFS device 6620 and one UFS card 6630 are connected to the switching module 6640 is illustrated as an example. However, a plurality of UFS devices and UFS cards may be connected in parallel or in the form of a star to the switching module 6640, and a plurality of UFS cards may be connected in series or in the form of a chain to the UFS device 6620.

Figure 18:
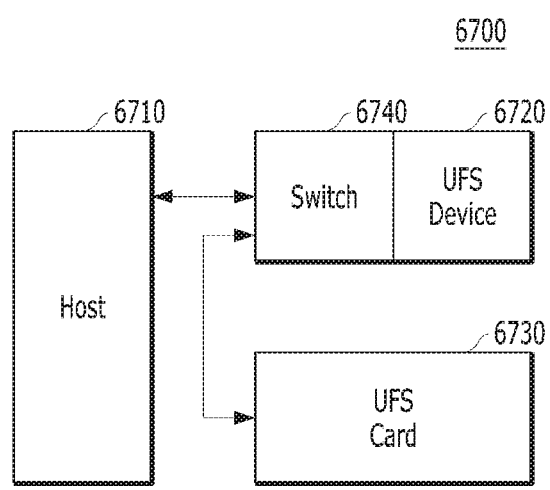

In the UFS system 6700 illustrated in FIG. 18, each of the host 6710, the UFS device 6720 and the UFS card 6730 may include UniPro. The host 6710 may communicate with the UFS device 6720 or the UFS card 6730 through a switching module 6740 performing a switching operation, for example, through the switching module 6740 which performs link layer switching at the UniPro, for example, L3 switching. The UFS device 6720 and the UFS card 6730 may communicate with each other through link layer switching of the switching module 6740 at the UniPro, and the switching module 6740 may be integrated as one module with the UFS device 6720 inside or outside the UFS device 6720. In the embodiment of FIG. 18, the configuration in which one UFS device 6720 and one UFS card 6730 are connected to the switching module 6740 is illustrated as an example. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 19:
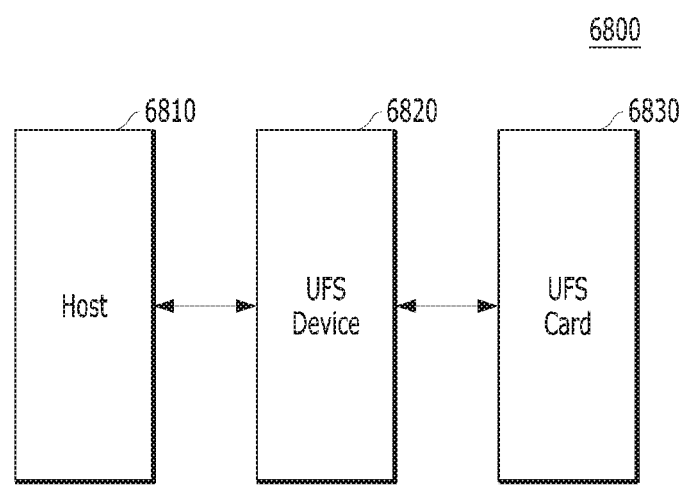

In the UFS system 6800 illustrated in FIG. 19, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target Identifier (ID) switching operation. The host 6810 and the UFS card 6830 may communicate with each other through target ID switching between the M-PHY and UniPro modules of the UFS device 6820. In the embodiment of FIG. 19, the configuration in which one UFS device 6820 is connected to the host 6810 and one UFS card 6830 is connected to the UFS device 6820 is illustrated as an example. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 20:
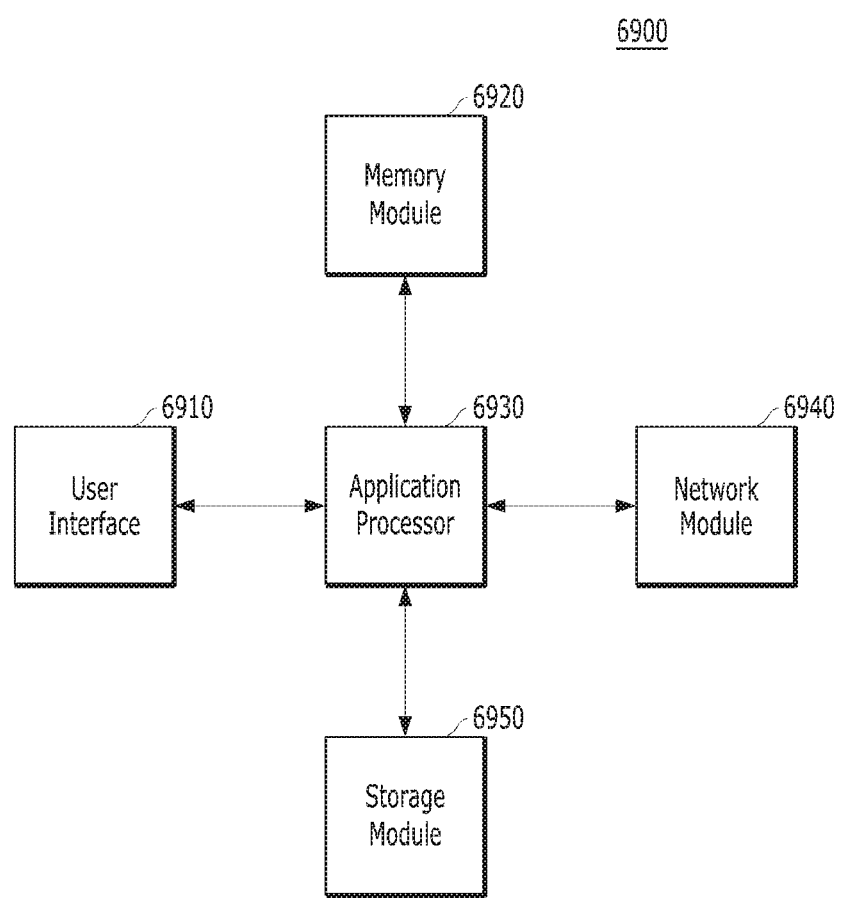

FIG. 20 is a diagram schematically illustrating another example of the data processing system including the controller in accordance with an embodiment. FIG. 20 is a diagram schematically illustrating a user system 6900 to which the memory system may be applied.

Referring to FIG. 20, the user system 6900 may include a user interface 6910, a memory module 6920, an application processor 6930, a network module 6940, and a storage module 6950.

More specifically, the application processor 6930 may drive components included in the user system 6900, for example, an operating system (OS), and include controllers, interfaces and a graphic engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile random access memory (RAM) such as a dynamic RAM (DRAM), a synchronous DRAM (SDRAM), a double data rate (DDR) SDRAM, DDR2 SDRAM, DDR3 SDRAM, LPDDR SDARM, LPDDR3 SDRAM or LPDDR3 SDRAM or a nonvolatile RAM such as a phase-change RAM (PRAM), a resistive RAM (ReRAM), a magneto-resistive RAM (MRAM) or a ferroelectric RAM (FRAM). For example, the application processor 6930 and the memory module 6920 may be packaged and mounted, based on Package on Package (PoP).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices or particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIG. 1. Furthermore, the storage module 6950 may be embodied as an SSD, eMMC and UFS as described above with reference to FIGS. 14 to 19.

In accordance with an embodiment, the storage module 6950 may perform selective data recovery operation on the target data to improve the reliability of the read operation. And the storage module 6950 may include a device suitable for determining the recovery soft read voltage to maximize the number of bits recovered by the selective data recovery operation.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIG. 2 is applied to a mobile electronic device of the user system 6900, the application processor 6930 may control overall operations of the mobile electronic device, and the network module 6940 may serve as a communication module for controlling wired and/or wireless communication with an external device. The user interface 6910 may display data processed by the processor 6930 on a display/touch module of the mobile electronic device, or support a function of receiving data from the touch panel.

Embodiments of the present invention provide a method for improving the reliability of a memory system by determining a recovery soft read voltage to maximize the number of bits which can be selectively recovered in the memory system, and thus provide a memory system with enhanced reliability.

Although various embodiments have been illustrated and described, it will be apparent to those skilled in the art in light of the present disclosure that various changes and modifications may be made without departing from the spirit and scope of the invention as defined in the following claims.

What is claimed is:

1. A controller for controlling a memory device, comprising:
 a read control component suitable for controlling a recovery soft read operation of the memory device on bits contained in error correction-failed data groups, when error correction on data of a target data group and error correction on one or more of data of corresponding data groups failed;
 an error correction code (ECC) component suitable for performing the error correction, and performing a selective data recovery operation on the target data group depending on reliabilities of the respective bits, derived as a result of the recovery soft read operation; and
 a read bias determiner suitable for determining a recovery soft read voltage to maximize the number of bits recovered by the selective data recovery operation, among bits contained in the target data group,
 wherein the read bias determiner determines the recovery soft read voltage to maximize the number of bits which are selectively recovered, based on an unreliability probability p (0<p<1) and a threshold voltage distribution of memory cells included in the memory device.

2. The controller of claim 1, wherein the ECC component performs the selective data recovery operation on the target data group by performing a data recovery operation on unreliable bits among the bits contained in the target data group as the result of the recovery soft read operation, when corresponding bits contained in the plurality of corresponding data groups are all reliable bits.

3. The controller of claim 2, wherein the read bias determiner determines the recovery soft read voltage to maximize the number of bits recovered by the selective data recovery operation among the bits contained in the target data group, based on the number of data groups including the target data group and the corresponding data groups.

4. The controller of claim 3, wherein the read bias determiner determines the recovery soft read voltage based on the unreliability probability p ($0<p<1$) at which a value of $p(1-p)^{n-1}$ is maximized, depending on the number of the data groups n.

5. The controller of claim 1, wherein the read bias determiner determines the recovery soft read voltage to maximize the number of bits which are selectively recovered, based on the average and standard deviation of the threshold voltage distribution of the memory cells included in the memory device.

6. The controller of claim 5, wherein the threshold voltage distribution of the memory cells follows a normal distribution.

7. The controller of claim 4, wherein the read bias determiner determines a step size s according to the unreliability probability p, a hard read voltage $V_{hd}$, and the average μ and standard deviation σ of threshold voltages of memory cells, based on $s=\mu-\sigma Q^{-1}(p)-V_{hd}$, and determines the recovery soft read voltage based on the step size s and the hard read voltage $V_{hd}$.

8. The controller of claim 1, wherein the ECC component further performs error correction on the data of the target data group on which the selective data recovery operation has been completed.

9. The controller of claim 1, wherein the ECC component performs the selective data recovery operation to recover data of unreliable bits among the bits contained in the target data group by performing an XOR operation on the unreliable bits and corresponding bits contained in the corresponding data groups.

10. An operation method of a controller which controls a memory device, the operation method comprising:
controlling a recovery soft read operation of the memory device on bits contained in error correction-failed data groups, when error correction on data of a target data group and error correction on one or more of data of corresponding data groups failed;
performing a selective data recovery operation on the target data group, depending on reliabilities of the respective bits, derived as a result of the recovery soft read operation; and
determining a recovery soft read voltage to maximize the number of bits recovered by the selective data recovery operation, among bits contained in the target data group,
wherein the recovery soft read voltage is determined to maximize the number of bits which are selectively recovered, based on an unreliability probability p ($0<p<1$) and a threshold voltage distribution of memory cells included in the memory device.

11. The operation method of claim 10, wherein the performing of the selective data recovery operation on the target data group comprises performing a data recovery operation on unreliable bits among bits contained in the target data group as the result of the recovery soft read operation, when corresponding bits contained in the plurality of corresponding data groups are all reliable bits.

12. The operation method of claim 11, wherein the determining of the recovery soft read voltage is performed based on the number of data groups including the target data group and the corresponding data groups.

13. The operation method of claim 12, wherein the determining of the recovery soft read voltage comprises determining the recovery soft read voltage based on the unreliability probability p ($0<p<1$) at which a value of $p(1-p)^{n-1}$ is maximized, depending on the number of the data groups n.

14. The operation method of claim 10, wherein the determining of the recovery soft read voltage is performed based on the average and standard deviation of the threshold voltage distribution of the memory cells included in the memory device.

15. The operation method of claim 13, wherein the determining of the recovery soft read voltage comprises determining a step size s according to the unreliability probability p, a hard read voltage $v_{hd}$, and the average μ and standard deviation σ of threshold voltages of memory cells, based on $s=\mu-\sigma Q^{-1}(p)-V_{hd}$, and determining the recovery soft read voltage based on the step size s and the hard read voltage $V_{hd}$.

16. The operation method of claim 10, further comprising error correction on the data of the target data group, on which the selective data recovery operation has been completed.

17. The operation method of claim 10, wherein the performing of the selective data recovery operation on the target data group comprises recovering data of unreliable bits among the bits contained in the target data group by performing an XOR operation on the unreliable bits and corresponding bits contained in the corresponding data groups.

18. A memory system, comprising:
a memory device; and
a controller configured to:
control the memory device to read data of a target data group into the controller, and perform a first error correction on the read data of the target data group,
control the memory device to read data of other data groups corresponding to the target data group into the controller, and perform a second error correction on the read data of the other data groups, when the first error correction failed, and
perform a selective data recovery operation on the target data group based on reliability information of bits in the target data group, when the second error correction failed,
wherein a recovery soft read voltage is determined to maximize the number of bits which are selectively recovered, based on an unreliability probability p ($0<p<1$) and a threshold voltage distribution of memory cells included in the memory device.

* * * * *

UNITED STATES PATENT AND TRADEMARK OFFICE
CERTIFICATE OF CORRECTION

PATENT NO. : 10,908,992 B2  
APPLICATION NO. : 16/291077  
DATED : February 2, 2021  
INVENTOR(S) : Jae-Yoon Lee Page 1 of 1

It is certified that error appears in the above-identified patent and that said Letters Patent is hereby corrected as shown below:

Change the (30) Foreign Application Priority Data section as follows:  
(30) Foreign Application Priority Data  
Aug. 27, 2018 (KR) ... 10-2018-0100117

Signed and Sealed this  
Ninth Day of March, 2021

Drew Hirshfeld  
*Performing the Functions and Duties of the*  
*Under Secretary of Commerce for Intellectual Property and*  
*Director of the United States Patent and Trademark Office*